(12) United States Patent
Hamazaki

(10) Patent No.: US 12,158,384 B2
(45) Date of Patent: Dec. 3, 2024

(54) PRESSURE SENSOR

(71) Applicant: Murata Manufacturing Co., Ltd., Nagaokakyo (JP)

(72) Inventor: Ryohei Hamazaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 258 days.

(21) Appl. No.: 17/983,446

(22) Filed: Nov. 9, 2022

(65) Prior Publication Data

US 2023/0068884 A1    Mar. 2, 2023

Related U.S. Application Data

(63) Continuation of application No. PCT/JP2021/019027, filed on May 19, 2021.

(30) Foreign Application Priority Data

Jun. 24, 2020 (JP) ................................ 2020-108892

(51) Int. Cl.
*G01L 19/06* (2006.01)
*G01L 19/02* (2006.01)
*G01L 19/14* (2006.01)

(52) U.S. Cl.
CPC ............. *G01L 19/06* (2013.01); *G01L 19/02* (2013.01); *G01L 19/146* (2013.01)

(58) Field of Classification Search
CPC ..... G01L 19/02; G01L 19/06; G01L 19/0609; G01L 19/0618; G01L 19/145; G01L 19/146; G01L 19/147; G01L 9/0041–9/008
See application file for complete search history.

(56) References Cited

U.S. PATENT DOCUMENTS

| 9,233,834 | B2 * | 1/2016 | Faralli | B81C 1/00158 |
| 2015/0369681 | A1 * | 12/2015 | Imai | G01L 19/145 73/727 |
| 2017/0176278 | A1 * | 6/2017 | Chen | G01L 19/148 |
| 2017/0247249 | A1 * | 8/2017 | Duqi | B81B 7/0061 |
| 2017/0253477 | A1 | 9/2017 | Baldo et al. | |
| 2018/0120184 | A1 * | 5/2018 | Yoshikawa | B81B 7/0019 |
| 2022/0034740 | A1 * | 2/2022 | Hsieh | H04R 1/04 |

FOREIGN PATENT DOCUMENTS

| CN | 107152983 A * | 9/2017 | ............... G01L 1/16 |
| DE | 102017103120 A1 * | 9/2017 | ............... G01L 1/16 |

OTHER PUBLICATIONS

International Search Report in PCT/JP2021/019027, mailed Jun. 22, 2021, 3 pages.
Written Opinion in PCT/JP2021/019027, mailed Jun. 22, 2021, 3 pages.

* cited by examiner

*Primary Examiner* — Herbert K Roberts
(74) *Attorney, Agent, or Firm* — Keating & Bennett, LLP

(57) ABSTRACT

A pressure sensor includes a base, a sensor facing the base in a height direction with a space between the sensor and the base to sense pressure applied to a sensing surface on a side opposite to the base in the height direction, a surrounding portion raised in the height direction from the base and surrounding the sensor with a groove extending around the sensor, between the surrounding portion and the sensor, a coupling portion coupling the sensor with the surrounding portion, and a beam in the groove to apply a resistance to the surrounding portion moving toward the sensor.

17 Claims, 10 Drawing Sheets

PRESSURE SENSOR

CROSS REFERENCE TO RELATED APPLICATIONS

This application claims the benefit of priority to Japanese Patent Application No. 2020-108892 filed on Jun. 24, 2020 and is a Continuation Application of PCT Application No. PCT/JP2021/019027 filed on May 19, 2021. The entire contents of each application are hereby incorporated herein by reference.

BACKGROUND OF THE INVENTION

1. Field of the Invention

The present invention relates to a pressure sensor that senses pressure from outside.

2. Description of the Related Art

Among pressure sensors, a pressure sensor that senses minute pressure is configured by micro electro mechanical systems (MEMS) in some cases.

The pressure sensor configured by MEMS includes a sensor having a film that is deformed in response to pressure applied from outside and a surrounding portion provided around the sensor. In this case, an impact acting on the surrounding portion from outside the pressure sensor reaches the sensor, and thus the sensor may be damaged.

In the pressure sensor disclosed in U.S. Patent Application Publication No. 2017/0253477, most of the portion between the sensor and the surrounding portion is isolated by a groove, and only a portion of the sensor and a portion of the surrounding portion are coupled by an arm. As a result, the impact on the surrounding portion is less likely to reach the sensor.

However, even if the sensor and the surrounding portion are separated by a groove, when a large impact acts on the surrounding portion at the time of falling and the like, as the surrounding portion moves and comes into contact with the sensor, the sensor may be damaged.

In addition, when a liquid, such as water, intrudes into the groove of the pressure sensor disclosed in the U.S. Patent Application Publication No. 2017/0253477, and the groove is occupied by the liquid, an impact acting on the surrounding portion is transmitted to the sensor through the liquid, and thus the sensor may be damaged.

SUMMARY OF THE INVENTION

Preferred embodiments of the present invention provide pressure sensors that are each able to reduce or prevent an impact from outside from reaching a sensor.

A pressure sensor according to a preferred embodiment of the present invention includes a base, a sensor facing the base in a height direction with a space between the sensor and the base to sense pressure applied to a sensing surface on a side opposite to the base in the height direction, a surrounding portion that is raised in the height direction from the base and surrounds the sensor with a groove around the sensor, between the surrounding portion and the sensor, a coupling portion that couples the sensor with the surrounding portion, and a damper portion in the groove to apply a resistance to the surrounding portion moving toward the sensor.

According to preferred embodiments of the present invention, an impact from outside to a sensor is able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
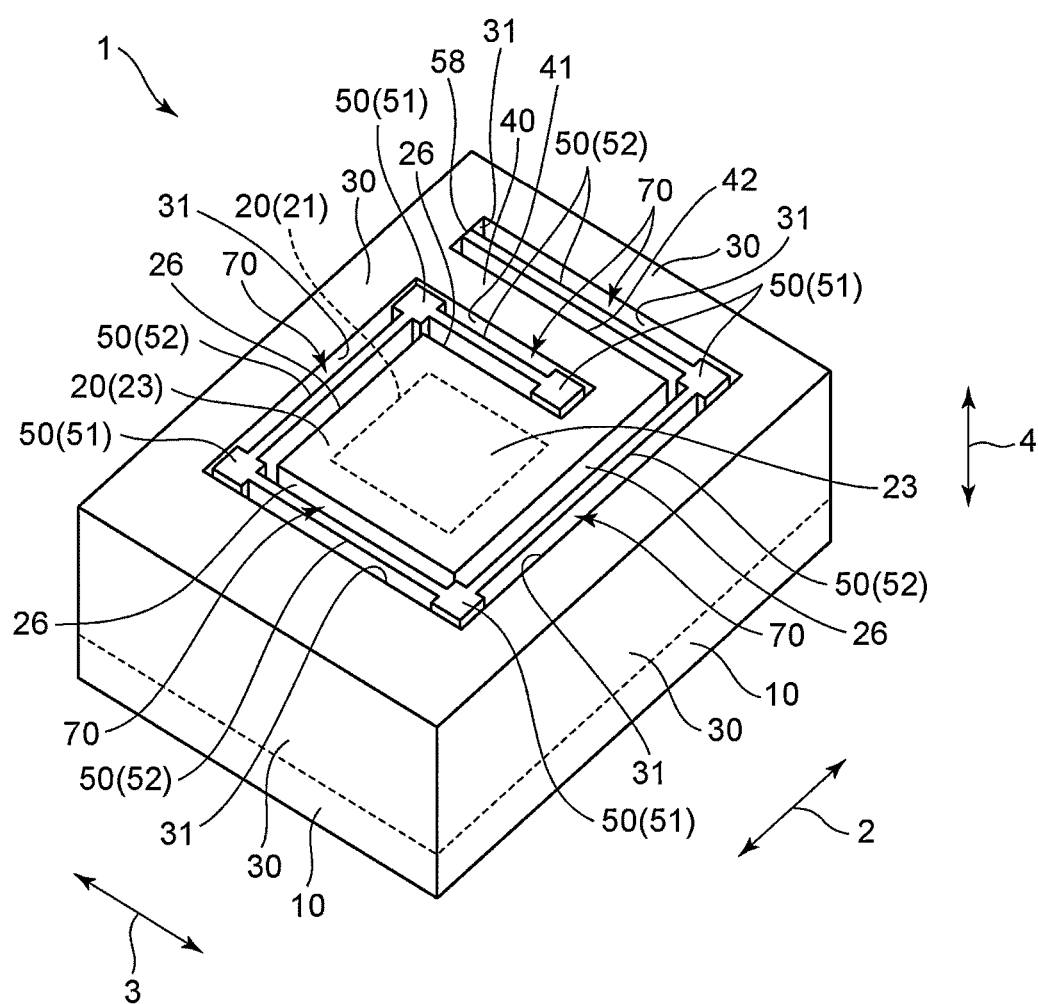
FIG. 1 is a perspective view of a pressure sensor according to a first preferred embodiment of the present invention.

A pressure sensor according to a preferred embodiment of the present invention includes a base, a sensor that faces the base in a height direction with a space between the sensor and the base to sense pressure applied to a sensing surface on a side opposite to the base in the height direction, a surrounding portion that is raised in the height direction from the base and surrounds the sensor with a groove, which is provided around the sensor, between the surrounding portion and the sensor, a coupling portion that couples the sensor with the surrounding portion, and a damper portion in the groove to apply a resistance to the surrounding portion moving toward the sensor.

According to the configuration described above, when an impact acts on the surrounding portion from outside the pressure sensor, transmission of the impact to the sensor from the surrounding portion is reduced or prevented by the damper portion provided in the groove. Therefore, the impact from outside to the sensor can be reduced or prevented. As a result, a possibility of damaging the sensor can be reduced or prevented.

The sensor may include an outer peripheral surface that faces the surrounding portion, the surrounding portion may include an inner peripheral surface that faces the outer peripheral surface, the groove may be provided between the outer peripheral surface and the inner peripheral surface, and the damper portion may include a beam supported by the base and extending along the groove with a gap between the beam and at least one of the outer peripheral surface and the inner peripheral surface.

According to the configuration described above, when an impact acts on the surrounding portion from outside the pressure sensor, the beam defines and functions as a cushion. Therefore, the impact from outside is reduced or prevented from reaching the sensor.

Moreover, according to the configuration described above, for the amount of the beam disposed in the groove, gaps between the beam, and the surrounding portion and the sensor are shortened. As a result, when an impact acts on the surrounding portion from outside the pressure sensor, by the effect of squeeze film damping, a resistance to the movement of the surrounding portion toward the sensor is generated, and thus transmission of the impact to the sensor can be reduced.

In addition, according to the configuration described above, for the amount of the beam disposed in the groove, gaps between the beam, and the surrounding portion and the sensor are shortened. Therefore, intrusion of a liquid such as water into the groove can be reduced or prevented by the surface tension of the liquid.

A pressure sensor according to a preferred embodiment of the present invention may further include a cap portion that faces the sensing surface with a space between the cap portion and the sensing surface, is supported by the surrounding portion, and includes a through-hole at a position facing the sensing surface. A longer gap of the gap between the damper portion and the outer peripheral surface and the gap between the damper portion and the inner peripheral surface may have a width shorter than a diameter of the through-hole.

The pressure sensor disclosed in U.S. Patent Application Publication No. 2017/0253477 includes a lid that covers the sensor from above so as to prevent intrusion of a liquid such as water into the pressure sensor. However, since the pressure sensor disclosed in U.S. Patent Application Publication No. 2017/0253477 is an atmospheric pressure sensor, the atmospheric air outside the pressure sensor cannot be completely blocked from the sensor. Therefore, in the pressure sensor disclosed in U.S. Patent Application Publication No. 2017/0253477, a through-hole that causes the sensor to be in communication with the atmospheric air is provided on the lid. Accordingly, the liquid intrudes into the groove inside the pressure sensor through the through-hole. On the other hand, according to the configuration described above, the width of the longer gap of the gap between the damper portion and the outer peripheral surface and the gap between the damper portion and the inner peripheral surface is configured to be shorter than the diameter of the through-hole. Therefore, even if the liquid intrudes into a space between the cap portion and the sensing surface through the through-hole, intrusion of the liquid into the groove can be reduced or prevented by the surface tension of the liquid.

In the pressure sensor disclosed in U.S. Patent Application Publication No. 2017/0253477, by reducing the diameter of the through hole, intrusion of the liquid into the pressure sensor can be reduced. However, when the diameter of the through-hole is reduced, gas flows inside and outside the pressure sensor rapidly changes, and thus a time lag up to the arrival of the atmospheric pressure outside the pressure sensor to the film inside the pressure sensor becomes large. According to the configuration described above, even when the liquid intrudes into the space between the cap portion and the sensing surface through the through-hole, intrusion of the liquid into the groove can be reduced or prevented, and thus, the diameter of the through-hole does not need to be reduced more than necessary. Therefore, an increase of a time lag as described above can be reduced or prevented.

A beam side surface of the beam facing the groove may include a beam projection. In addition, the outer peripheral surface may include an outer peripheral projection. In addition, a coupling side surface of the coupling portion facing the groove may include a coupling projection.

If a liquid such as water intrudes into the groove and is attached to the beam, the sensor, the surrounding portion, or the coupling portion, the beam is stuck to the outer peripheral surface of the sensor, the inner peripheral surface of the surrounding portion, or the coupling side surface of the coupling portion due to the surface tension of the liquid, and the beam may remain stuck even after the beam and the like are dried. In this case, there is a possibility that the beam will not be able to fully demonstrate the function as a damper portion. On the other hand, according to the configuration described above, a projection is provided on the beam side surface of the beam, the outer peripheral surface of the sensor, and the coupling side surface of the coupling portion. Therefore, even when the beam comes into contact with the sensor, the surrounding portion, or the coupling portion, the contact area can be reduced. As a result, the above-described sticking or maintenance of the above-described sticking can be reduced or prevented.

A beam side surface of the beam facing the groove may include a first projection and a first recess, and the outer peripheral surface may include a second recess at a position facing the first projection and include a second projection at a position facing the first recess. In addition, a coupling side surface of the coupling portion facing the groove may include a third recess at a position facing the first projection and include a third projection at a position facing the first recess. According to this configuration, the groove width can be made constant or substantially constant. Therefore, the advantageous effect of squeeze film damping when an impact acts on the surrounding portion from outside the pressure sensor can be maintained constant or substantially constant at each position of the groove.

The damper portion may include a gel that occupies at least a portion of the groove. According to this configuration, when an impact acts on the surrounding portion from outside the pressure sensor, transmission of the impact from the surrounding portion to the sensor can be reduced or prevented by the gel. In addition, according to the configuration described above, intrusion of a liquid such as water into the portion, inside the groove, occupied by the gel can be reduced or prevented.

First Preferred Embodiment

Figure 2:
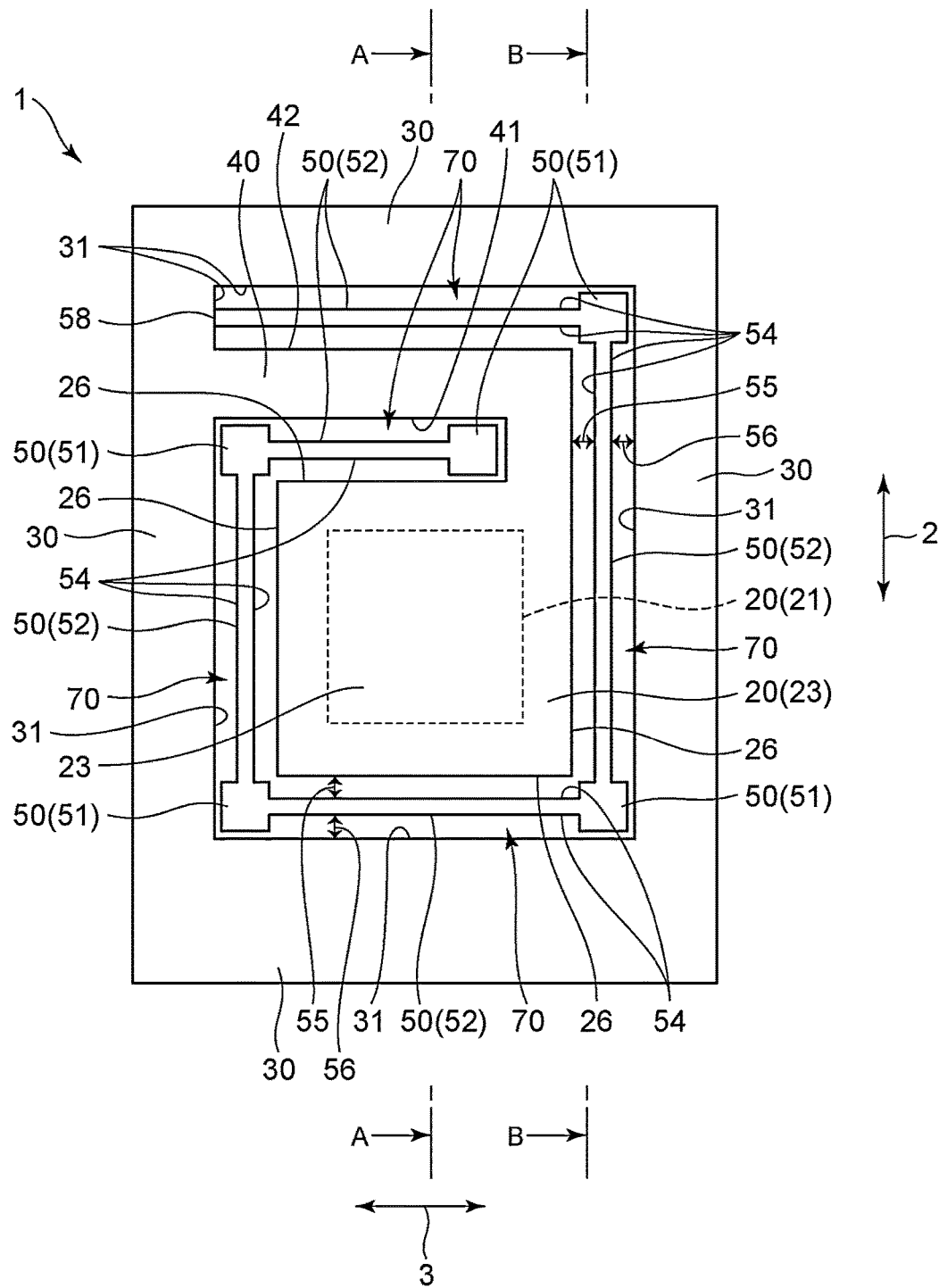
FIG. 2 is a plan view of the pressure sensor of FIG. 1.
Figure 3:
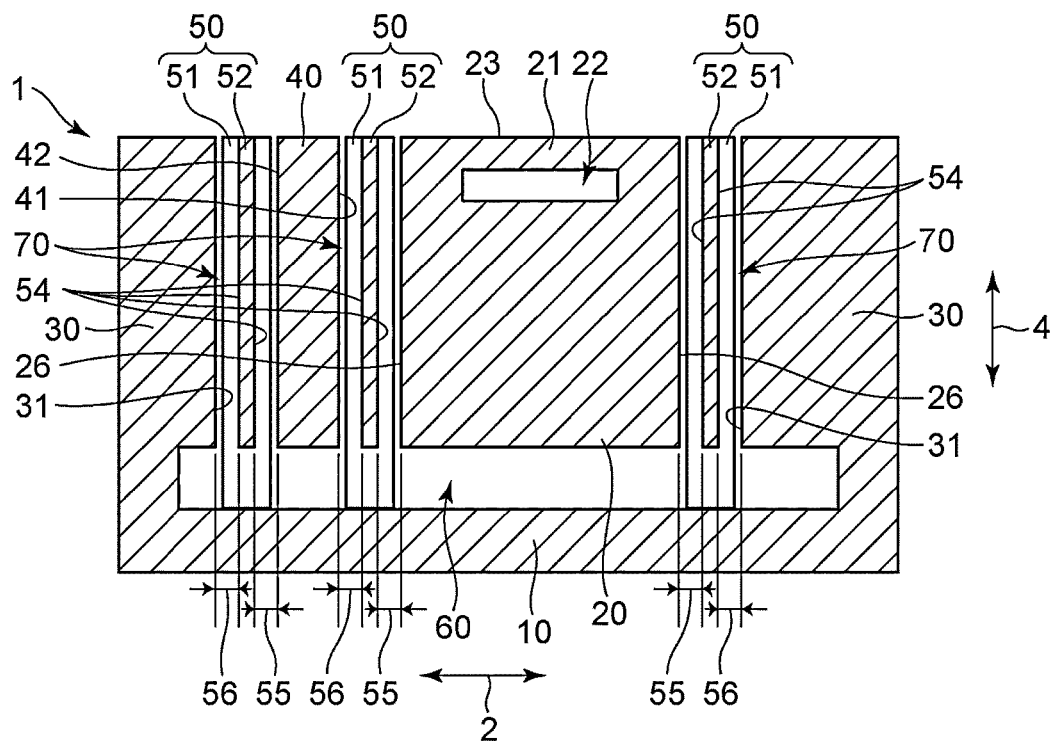
FIG. 3 is a sectional view cut along line A-A in FIG. 2.
Figure 4:
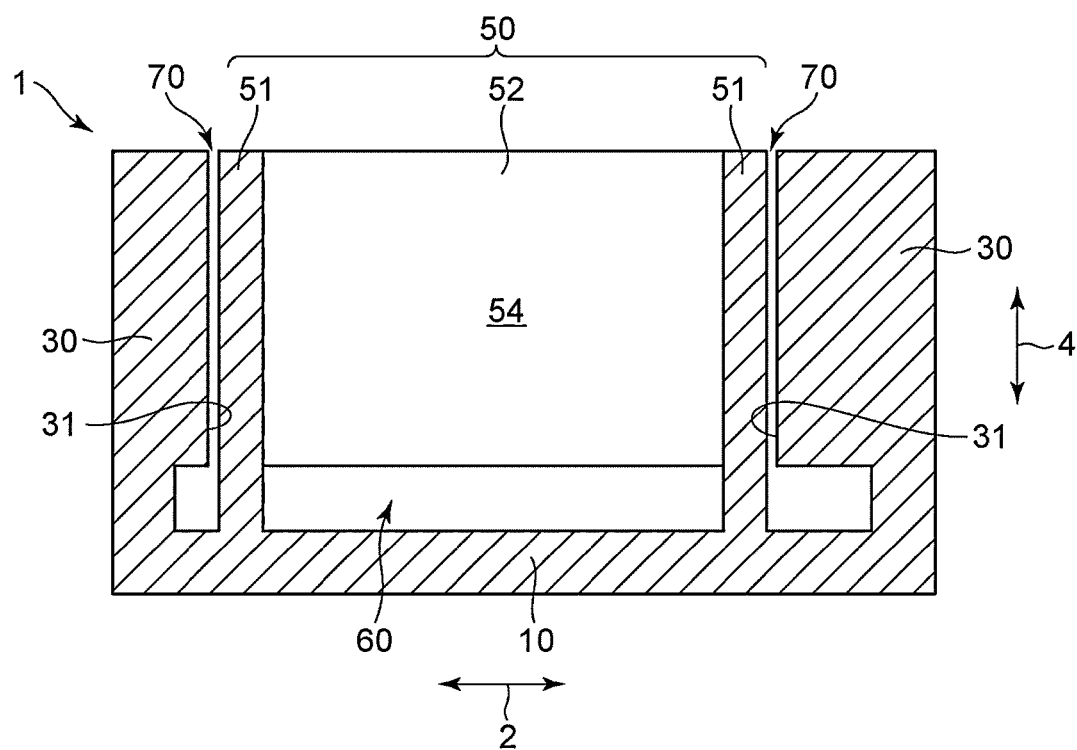
FIG. 4 is a sectional view cut along line B-B in FIG. 2.

FIG. 1 is a perspective view of a pressure sensor according to a first preferred embodiment of the present invention. FIG. 2 is a plan view of the pressure sensor of FIG. 1. FIG. 3 is a sectional view cut along line A-A in FIG. 2. FIG. 4 is a sectional view cut along line B-B in FIG. 2.

An external configuration of a pressure sensor 1 according to the first preferred embodiment of the present invention has, as illustrated in FIG. 1, a rectangular or substantially rectangular parallelepiped shape. In the first preferred embodiment, each side of the rectangular or substantially rectangular parallelepiped shape of the pressure sensor 1 is several hundred μm (for example, approximately 700 μm). The pressure sensor 1 senses minute pressure and is a device configured by micro electro mechanical systems (MEMS). The pressure sensor 1 may have a shape other than the rectangular or substantially rectangular parallelepiped shape such as, for example, a cylindrical or substantially cylindrical shape.

As illustrated in FIGS. 1 to 3, the pressure sensor 1 includes a base 10, a sensor 20, a surrounding portion 30, a coupling portion 40, and a beam 50. The base 10, the sensor 20, the surrounding portion 30, the coupling portion 40, and the beam 50 are integrally provided. The pressure sensor 1 is manufactured so as to be formed into the shapes illustrated in FIGS. 1 to 3 by a known semiconductor manufacturing process. The base 10, the sensor 20, the surrounding portion 30, the coupling portion 40, and the beam 50 are configured by a semiconductor material such as silicon.

In the following description of each portion of the pressure sensor 1, respective directions of the sides of the rectangular or substantially rectangular parallelepiped shape of the pressure sensor 1 are defined as a longitudinal direction 2, a widthwise direction 3, and a height direction 4. In the height direction 4, a base 10 side is defined as down, and a sensing film 21 side of the sensor 20 is defined as up.

As illustrated in FIGS. 1 to 3, the base 10 has a rectangular or substantially rectangular parallelepiped plate shape. The lengths of the base 10 in the longitudinal direction 2 and the widthwise direction 3 are longer than the length of the base 10 in the height direction 4.

As illustrated in FIG. 3, the sensor 20 is located above the base 10 at an interval from the base 10. The sensor 20 is disposed to face the base 10 in the height direction 4 with a space 60 therebetween. As illustrated in FIG. 2, the base 10 is supported by the surrounding portion 30 described later using the coupling portion 40 described later.

As illustrated in FIGS. 1 and 3, the sensor 20 has a quadratic prism shape. As illustrated in FIGS. 1 and 2, in plan view, the sensor 20 is located in a central portion of the pressure sensor 1. In plan view, the sensor 20 has a square or substantially square shape. In the first preferred embodiment, the length of each side of the square (the lengths in the longitudinal direction 2 and the widthwise direction 3) is, for example, approximately 350 μm. The shape of the sensor 20 may be a shape other than a quadratic prism shape such as, for example, a cylindrical or substantially cylindrical shape, and the size of the sensor 20 is not limited to the above-described size.

As illustrated in FIG. 3, the sensor 20 includes a cavity 22 in an upper portion thereof. A portion above the cavity 22 in the sensor 20 is a sensing film 21 which is thin. In the first preferred embodiment, the thickness of the sensing film 21 (the length in the height direction 4) is, for example, approximately 10 μm, but the thickness is not limited thereto. The lower surface of the sensing film 21 faces the cavity 22. A sensing surface 23, which is the upper surface of the sensing film 21, faces the outside of the pressure sensor 1. The sensing surface 23 is located on a side opposite to the base 10 in the height direction 4.

The sensing film 21 deforms by pressure acting on the sensing surface 23 from the outside of the pressure sensor 1, that is, from above. As a result, the sensing film 21 senses pressure that is applied to the sensing surface 23. The physical quantity due to deformation of the sensing film 21 is converted into an electric signal by an electrode or a strain gauge (not illustrated) built in the pressure sensor 1 or externally coupled to the pressure sensor 1. An external device incorporating the pressure sensor 1 or coupled to the pressure sensor 1 detects pressure based on the electric signal. The external device is, for example, a smart watch, a pedometer, an altimeter, or the like.

As illustrated in FIG. 3, the surrounding portion 30 is raised upward from the base 10. The lower end portion of the surrounding portion 30 is coupled to the upper end portion of the base 10. In the first preferred embodiment, in the height direction 4, the upper end of the surrounding portion 30 is located at the same position or substantially the same position as the upper end of the sensor 20.

As illustrated in FIGS. 1 and 2, the surrounding portion 30 is provided on each side of the sensor 20 in the longitudinal direction 2 and on each side of the sensor 20 in the widthwise direction 3. In plan view, the surrounding portion 30 surrounds the sensor 20. The surrounding portion 30 is spaced away at an interval from the sensor 20. By the interval, a groove 70 is provided.

As illustrated in FIG. 2, in plan view, the groove 70 is provided around the sensor 20. As illustrated in FIG. 3, the lower end portion of the groove 70 is in communication with the space 60. The groove 70 is located on an inner side (a sensor 20 side) of the outer edge of the space 60. In the first preferred embodiment, the width of the groove 70, that is, the length of the groove 70 in a width direction orthogonal or substantially orthogonal to both of the height direction 4 and a direction in which the groove 70 extends is preferably equal to or more than about 15 μm and equal to or less than about 20 μm, for example. However, the width of the groove 70 is not limited to the above-described range.

As illustrated in FIGS. 1 and 2, the coupling portion 40 extends so as to cross the groove 70. One end of the coupling portion 40 is coupled to the sensor 20. The other end of the coupling portion 40 is coupled to the surrounding portion 30. The coupling portion 40 couples the sensor 20 with the surrounding portion 30. In the first preferred embodiment, the coupling portion 40 extends in the longitudinal direction 2 from the sensor 20, is bent in the leading end portion in the longitudinal direction 2, and extends in the widthwise direction 3 toward the surrounding portion 30. The shape of the coupling portion 40 is not limited to a bent shape as described above. For example, the coupling portion 40 may extend only in the widthwise direction 3 so as to cross the groove 70, in the widthwise direction 3, extending in the longitudinal direction 2 or may extend only in the longitudinal direction 2 so as to cross the groove 70, in the longitudinal direction 2, extending in the widthwise direction 3.

As illustrated in FIGS. 1 to 3, the beam 50 is provided in the groove 70. The beam 50 is an example of a damper portion. As illustrated in FIGS. 1 and 2, the beam 50 extends along the groove 70. One end 58 of the beam 50 in a direction along the groove 70 is coupled to a surface, of an inner peripheral surface 31 of the surrounding portion 30, defining one end of the groove 70.

In the first preferred embodiment, the beam 50 includes a pillar 51 and an elastic film 52.

As illustrated in FIGS. 1 and 2, the pillar 51 is located in a portion where the groove 70 is bent. As illustrated in FIG. 3, the pillar 51 is raised upward from the base 10. That is, the lower end portion of the pillar 51 is coupled to the upper end portion of the base 10 and is supported by the base 10. In the first preferred embodiment, the upper end of the pillar 51 is located at the same or substantially the same position as the upper ends of the sensor 20 and the surrounding portion 30 in the height direction 4. In the first preferred embodiment, the pillar 51 has a quadratic prism shape. As illustrated in FIGS. 1 and 2, the length of one side of the square or substantially square of the pillar 51, which is a quadratic prism, is shorter than the width of the groove 70. That is, there are gaps between the pillar 51, and the sensor 20 and the surrounding portion 30. The shape of the pillar 51 is not limited to a quadratic prism and may be, for example, a cylinder.

As illustrated in FIGS. 1 and 2, the elastic film 52 extends along the groove 70. Each end portion of the elastic film 52 in a direction along the groove 70 is coupled to the pillar 51. However, a portion corresponding to the one end 58 of the beam 50, of the end portions of the elastic film 52 in a direction along the groove 70, is coupled to the inner peripheral surface 31 of the surrounding portion 30, instead of the pillar 51.

As illustrated in FIGS. 2 and 3, the width of the elastic film 52 is shorter than the width of the groove 70 and shorter than the length of one side of the square of the pillar 51, which is a quadratic prism. In the first preferred embodiment, the elastic film 52 extends while maintaining gaps 55 and 56 between the elastic film 52 and both side surfaces of the groove 70. Both side surfaces of the groove 70 define both ends of the groove 70 in the width direction. The inner peripheral surface 31 of the surrounding portion 30 and a side surface 41 of the coupling portion 40 each define an outer end of the groove 70. An outer peripheral surface 26 of the sensor 20 and a side surface 42 of the coupling portion 40 each define an inner end of the groove 70. The gap 55 is a width of the groove 70 between the elastic film 52 and the inner end of the groove 70 (the outer peripheral surface 26 and the side surface 42). The gap 56 is a width of the groove 70 between the elastic film 52 and the outer end of the groove 70 (the inner peripheral surface 31 and the side surface 41). The outer peripheral surface 26 and the inner peripheral surface 31 face each other with the beam 50 interposed therebetween. The side surface 41 and the outer peripheral surface 26 face each other with the beam 50 interposed therebetween. The side surface 42 and the inner peripheral surface 31 face each other with the beam 50 interposed therebetween.

The gaps 55 and 56 are longer than the gaps between the pillar 51, and the sensor 20 and the surrounding portion 30. The gaps 55 and 56 are preferably equal to or less than about 10 μm, for example. In the first preferred embodiment, the gaps 55 and 56 are, for example, about 5 μm. The lengths of the gaps 55 and 56 are not limited to the above-described length. In the first preferred embodiment, the lengths of the gaps 55 and 56 are the same or substantially the same, but may be different.

Since the beam 50 is disposed in the groove 70, the space defining the groove 70 includes two spaces each having a width of, for example, about 5 μm. On the other hand, if the beam 50 is not disposed in the groove 70, the space defining the groove 70 includes one space having a width of, for example, about 15 μm to about 20 μm. That is, since the beam 50 is disposed in the groove 70, the width of a space defining the groove 70 is reduced.

In the first preferred embodiment, as illustrated in FIGS. 3 and 4, in the height direction 4, the upper end of the elastic film 52 is located at the same position or substantially the same position as the upper end of the pillar 51. In the height direction 4, the lower end of the elastic film 52 is located above the lower end of the pillar 51. That is, in the height direction 4, the elastic film 52 is disposed at an interval from the base 10. As a result, the elastic film 52 is likely to bend in the width direction.

When an impact acts toward the inside of the surrounding portion 30 from outside the pressure sensor 1, the surrounding portion 30 bends or deforms inward towards the sensor 20. At this time, in the space (the gaps 55 and 56) having a width of, for example, about 5 μm as described above, a resistance to the movement of the surrounding portion 30 towards the inside is generated by the effect of squeeze film damping. In addition, when the surrounding portion 30 that has moved inward comes into contact with the elastic film 52, the elastic film 52 is pushed by the surrounding portion 30 and bends inward. At this squeeze time, an elastic force toward the outside is generated in the elastic film 52. The elastic force acts as a resistance to the movement of the surrounding portion 30 toward the inside.

According to the first preferred embodiment, when an impact acts on the surrounding portion 30 from outside the pressure sensor 1, transmission of the impact to the sensor 20 from the surrounding portion 30 is mitigated by the beam 50 provided in the groove 70. Therefore, the impact from outside is reduced or prevented from reaching the sensor 20. As a result, a possibility of damaging the sensor 20 can be reduced.

According to the first preferred embodiment, when an impact acts on the surrounding portion 30 from outside the pressure sensor 1, the beam 50 defines and functions as a cushion. Therefore, the impact from outside is reduced or prevented from reaching the sensor 20.

According to the first preferred embodiment, for the amount of the beam 50 disposed in the groove 70, gaps between the beam 50, and the surrounding portion 30 and the sensor 20 are shortened. As a result, when an impact acts on the surrounding portion 30 from outside the pressure sensor 1, by the effect of squeeze film damping, a resistance to the movement of the surrounding portion 30 toward the sensor 20 is generated, and thus transmission of the impact to the sensor 20 can be reduced.

According to the first preferred embodiment, for the amount of the beam 50 disposed in the groove 70, gaps between the beam 50, and the surrounding portion 30 and the sensor 20 are shortened. Therefore, intrusion of a liquid such as water into the groove 70 can be reduced or prevented by the surface tension of the liquid.

In the first preferred embodiment, the elastic film 52 extends while maintaining the gaps 55 and 56 between the elastic film 52 and both side surfaces of the groove 70. However, the elastic film 52 may extend while maintaining a gap between the elastic film 52 and only one of the side surfaces of the groove 70. In other words, the elastic film 52 may be in contact with the inner end (the outer peripheral surface 26 and the side surface 42) of the groove 70. In this case, the gap 55 does not exist, and only the gap 56 exists. In addition, the elastic film 52 may be in contact with the outer end (the inner peripheral surface 31 and the side surface 41) of the groove 70. In this case, the gap 56 does not exist, and only the gap 55 exists.

In the first preferred embodiment, as illustrated in FIG. 2, the pillar 51 of the beam 50 is located in a portion where the groove 70 is bent. However, the pillar 51 may be located in a portion where the groove 70 is not bent.

In the first preferred embodiment, as illustrated in FIGS. 3 and 4, the lower end of the elastic film 52 of the beam 50 is located at the same or substantially the same position as the lower end of the sensor 20 and the upper end of the space 60 in the height direction 4. However, the lower end of the elastic film 52 may be located below the lower end of the sensor 20 and the upper end of the space 60 or may be located above the lower end of the sensor 20 and the upper end of the space 60.

In the first preferred embodiment, the lower end of the elastic film 52 is located above the lower end of the pillar 51 but may be located at the same or substantially the same position as the lower end of the pillar 51. That is, the elastic film 52 may be coupled to the upper end portion of the base 10 and supported by the base 10, similarly to the pillar 51.

In the first preferred embodiment, the beam 50 includes the pillar 51 and the elastic film 52, but the beam 50 does not have to include the pillar 51. In this case, at least a portion of the elastic film 52 is supported by the base 10.

Second Preferred Embodiment

Figure 5:
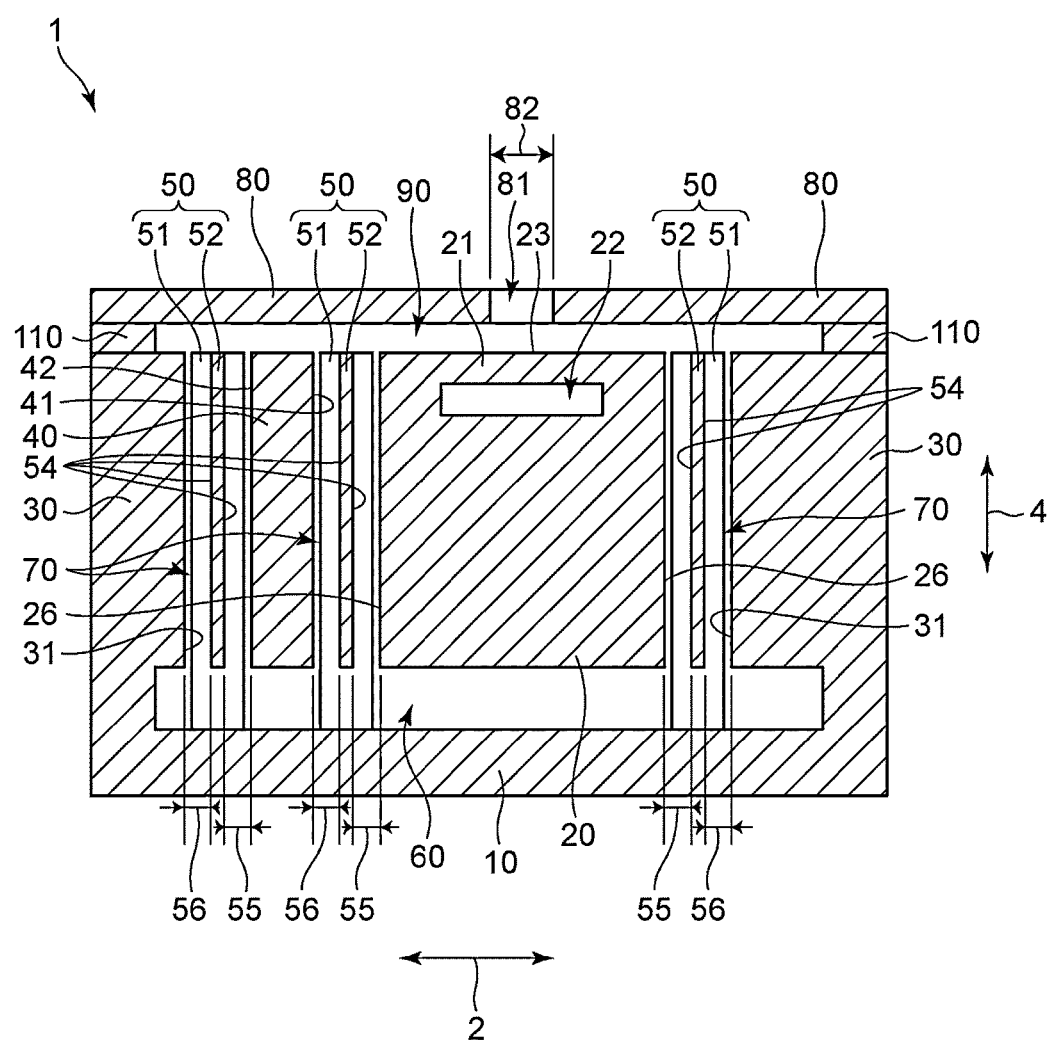
FIG. 5 is a sectional view, similar to FIG. 3, of a pressure sensor according to a second preferred embodiment of the present invention.

FIG. 5 is a sectional view, similar to FIG. 3, of a pressure sensor according to a second preferred embodiment of the present invention.

The pressure sensor according to the second preferred embodiment is different from the pressure sensor according to the first preferred embodiment in that, as illustrated in FIG. 5, a cap portion 80 is included.

The cap portion 80 has a rectangular or substantially rectangular parallelepiped plate shape. The lengths of the cap portion 80 in the longitudinal direction 2 and the widthwise direction 3 are longer than the length of the cap portion 80 in the height direction 4. In the second preferred embodiment, the cap portion 80 is defined by a semiconductor material, such as, for example, silicon, and the like similarly to the base 10.

The cap portion 80 faces the sensor 20 and the surrounding portion 30 in the height direction 4. The cap portion 80 is disposed above the sensor 20 at an interval from the sensor 20. The cap portion 80 faces the sensor 20 in the height direction 4 with a space 90 therebetween.

The cap portion 80 is supported by the surrounding portion 30 around the sensor 20. In the second preferred embodiment, a coupling portion 110 is disposed in the height direction 4 between the cap portion 80 and the surrounding portion 30. The coupling portion 110 made of, for example, a metal material such as copper, a polymer material, a glass material, or the like. The lower surface of the coupling portion 110 is in contact with the upper surface of the surrounding portion 30 from above. Accordingly, the coupling portion 110 is supported by the surrounding portion 30. The lower surface of the cap portion 80 is in contact with the upper surface of the coupling portion 110 from above. Accordingly, the cap portion 80 is supported by the surrounding portion 30 with the coupling portion 110 interposed therebetween.

In the second preferred embodiment, the coupling portion 110 is separated from the cap portion 80 and the surrounding portion 30, but the coupling portion 110 may be provided integrally with the cap portion 80 and the surrounding portion 30.

The cap portion 80 includes a through-hole 81 that penetrates the cap portion 80 in the height direction 4. The through-hole 81 is provided at a position where the through-hole 81 faces the sensing surface 23 of the sensing film 21 of the sensor 20 in the height direction 4. A diameter 82 of the through-hole 81 is longer than the width of each of the gaps 55 and 56 (5 μm in the second preferred embodiment, similarly to the first preferred embodiment).

When the lengths of the gaps 55 and 56 are different from each other, the diameter 82 of the through-hole 81 is longer than the longer one of the gaps 55 and 56.

The pressure sensor disclosed in U.S. Patent Application Publication No. 2017/0253477 includes a lid that covers the sensor from above so as to prevent intrusion of a liquid such as water into the pressure sensor. However, since the pressure sensor disclosed in U.S. Patent Application Publication No. 2017/0253477 is an atmospheric pressure sensor, the atmospheric air outside the pressure sensor cannot be completely blocked from the sensor. Therefore, in the pressure sensor disclosed in U.S. Patent Application Publication No. 2017/0253477, a through-hole that causes the sensor to be in communication with the atmospheric air is provided in the lid. Accordingly, the liquid intrudes into the groove inside the pressure sensor through the through-hole. On the other hand, according to the second preferred embodiment, the widths of the gaps 55 and 56 are shorter than the diameter of the through-hole 81. Therefore, even if the liquid intrudes into the space 90 between the cap portion 80 and the sensing surface 23 through the through-hole 81, intrusion of the liquid into the groove 70 can be reduced or prevented by the surface tension of the liquid.

In the pressure sensor disclosed in U.S. Patent Application Publication No. 2017/0253477, by reducing the diameter of the through-hole, intrusion of the liquid into the pressure sensor can be reduced. However, when the diameter of the through-hole is reduced, gas flows inside and outside the pressure sensor rapidly change, and thus a time lag up to the arrival of the atmospheric pressure outside the pressure sensor to the film inside the pressure sensor becomes large. According to the second preferred embodiment, as described above, even when the liquid intrudes into the space 90 between the cap portion 80 and the sensing surface 23 through the through-hole 81, intrusion of the liquid into the groove 70 can be reduced or prevented, and thus the diameter of the through-hole 81 does not need to be reduced more than necessary. Therefore, an increase of a time lag as described above can be reduced or prevented.

Third Preferred Embodiment

Figure 6:
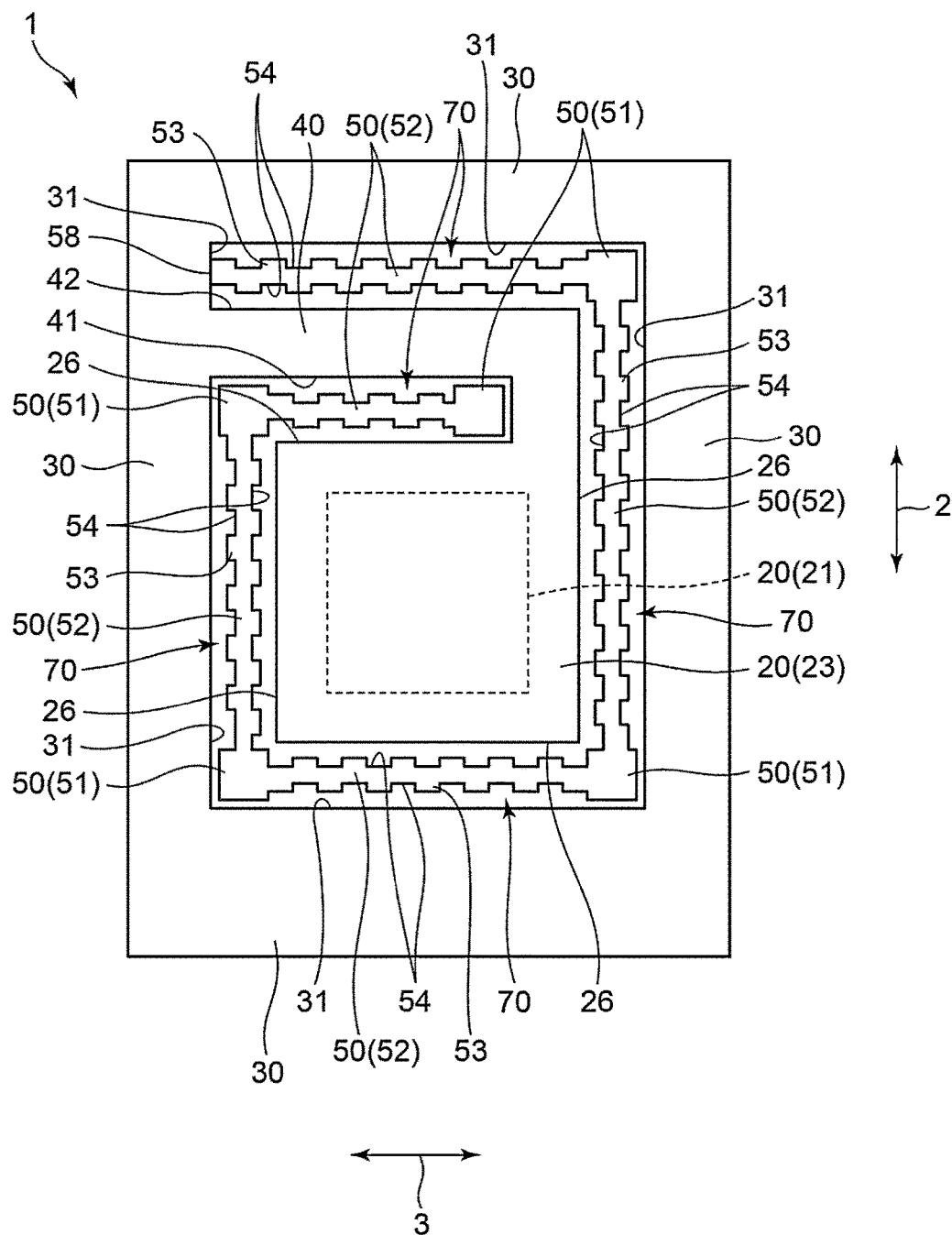
FIG. 6 is a plan view of a pressure sensor according to a third preferred embodiment of the present invention.

FIG. 6 is a plain view of a pressure sensor according to a third preferred embodiment of the present invention.

The pressure sensor according to the third preferred embodiment is different from the pressure sensor according to the first preferred embodiment in that, as illustrated in FIG. 6, the beam 50 includes a projection.

As illustrated in FIG. 6, the beam 50 includes a projection 53 on a side surface 54 of the elastic film 52. The side surface 54 of the elastic film 52 faces the groove 70 and faces both side surfaces (the inner peripheral surface 31, the outer peripheral surface 26, the side surface 41, and the side surface 42) of the groove 70. The side surface 54 of the elastic film 52 is an example of a beam side surface. The projection 53 is an example of a beam projection.

In the third preferred embodiment, a plurality of projections 53 are provided at a fixed interval in a direction in which the groove 70 extends. Each projection 53 extends from the upper end to the lower end of the elastic film 52 in the height direction 4. The cross section of each projection 53 has a rectangular or substantially rectangular shape. That is, the projection 53 has a quadratic prism shape.

If a liquid such as water intrudes into the groove 70 and is attached to the beam 50, the sensor 20, the surrounding portion 30, or the coupling portion 40, the beam 50 is stuck to the outer peripheral surface 26 of the sensor 20, the inner peripheral surface 31 of the surrounding portion 30, or the side surface 41 or 42 of the coupling portion 40 due to the surface tension of the liquid, and the beam 50 may remain stuck even after the beam 50 and the like are dried. In this case, there is a possibility that the beam 50 is not able to fully provide the function as a damper portion. On the other hand, according to the third preferred embodiment, the beam 50 includes the projection 53 on the side surface 54. Therefore, even when the beam 50 comes into contact with the sensor 20, the surrounding portion 30, or the coupling portion 40, the contact area can be reduced. As a result, the above-described sticking or maintenance of the above-described sticking can be reduced or prevented.

In the third preferred embodiment, the projection 53 is provided at a fixed or substantially fixed interval in a direction in which the groove 70 extends, but the interval does not need to be fixed or substantially fixed.

In the third preferred embodiment, as illustrated in FIG. 6, the shape and the size of each of the plurality of projections 53 are the same or substantially the same, but the shape and the size of each projection 53 do not need to be the same or substantially the same.

In the third preferred embodiment, as illustrated in FIG. 6, the projections 53 are provided over the entire or substantially the entire area of the elastic film 52 of the beam 50, but the projections 53 may be provided only in a portion of the elastic film 52. For example, the projections 53 may be located only near a portion where the groove 70 is bent.

The number of the projections 53 may be less or more than the number illustrated in FIG. 6. For example, only one projection 53 may be provided on the elastic film 52 between two pillars 51.

In the third preferred embodiment, each projection 53 has a quadratic prism shape, but the shape is not limited to a quadratic prism. For example, each projection 53 may have a triangular or substantially triangular prism (see FIG. 9) or a semi-cylindrical or substantially semi-cylindrical shape.

In the third preferred embodiment, the projection 53 extends from the upper end to the lower end of the elastic film 52, but the configuration is not limited thereto, and the projection 53 may be provided only in a portion of an area between the upper end and the lower end of the elastic film 52. For example, the projection 53 may have a hemispherical or substantially hemispherical shape.

In the third preferred embodiment, the projection 53 extends in the height direction 4, but the projection 53 may extend in a direction other than the height direction 4.

Figure 9:
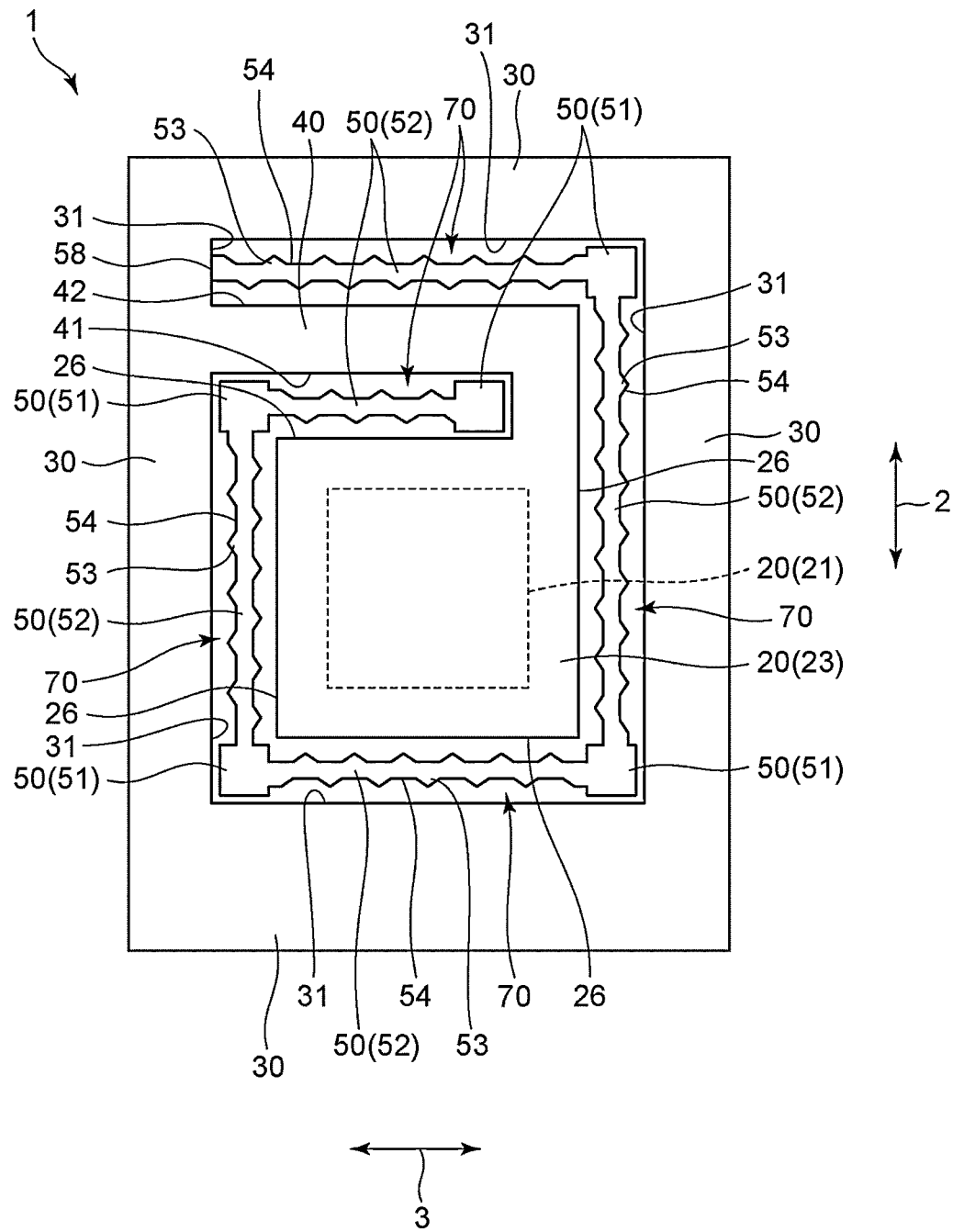
FIG. 9 is a plan view of a pressure sensor according to a modification of each preferred embodiment of the present invention.
Figure 10:
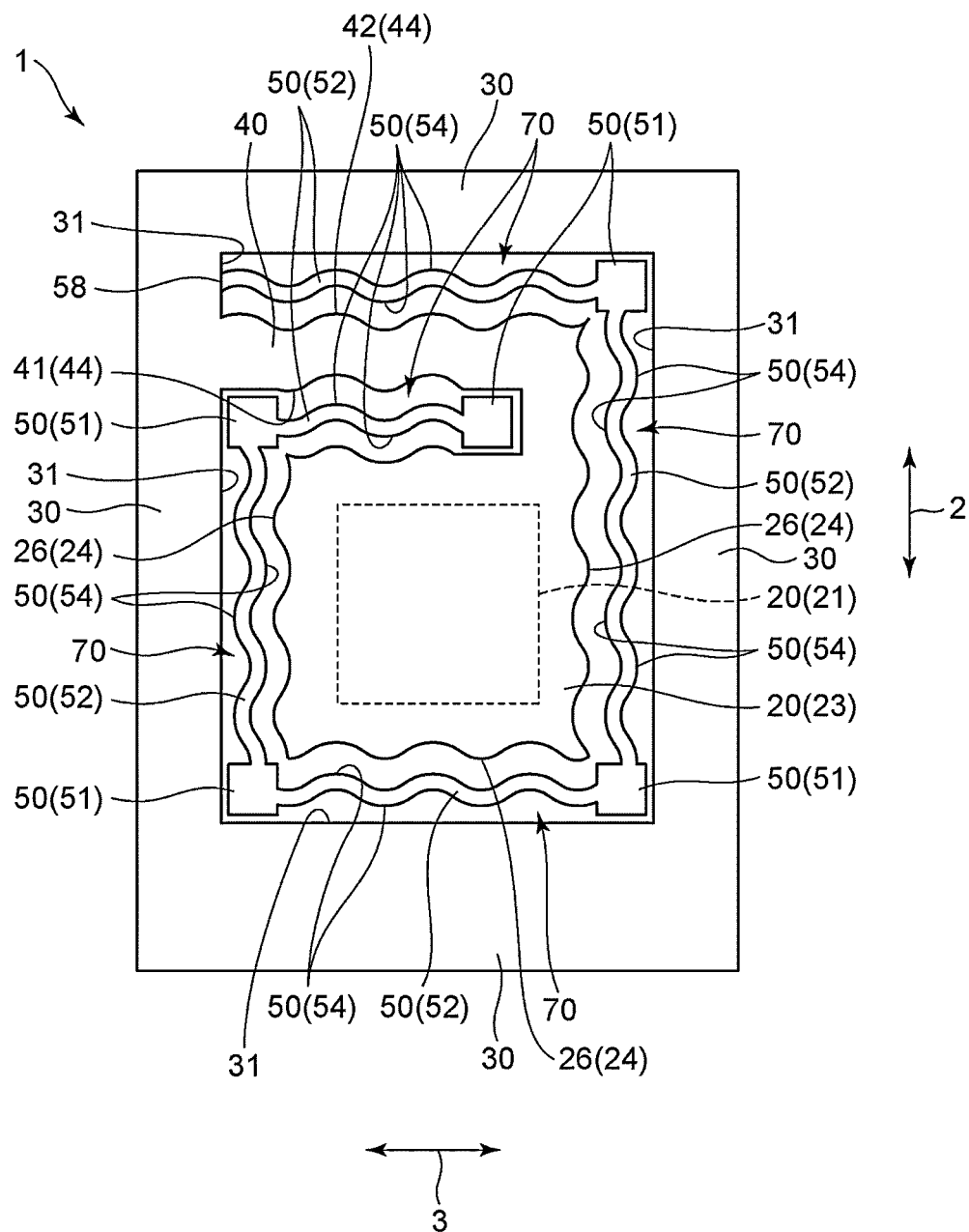
FIG. 10 is a plan view of a pressure sensor according to a modification of each preferred embodiment of the present invention.

The shape of the beam 50 is not limited to the shapes illustrated in FIGS. 6 and 9. For example, as illustrated in FIG. 10, in plan view, the elastic film 52 may have a wave form. In this case, a portion of the wave form that is curved such that the distance from the both side surfaces of the groove 70 is shortened corresponds to the projection 53.

Fourth Preferred Embodiment

Figure 7:
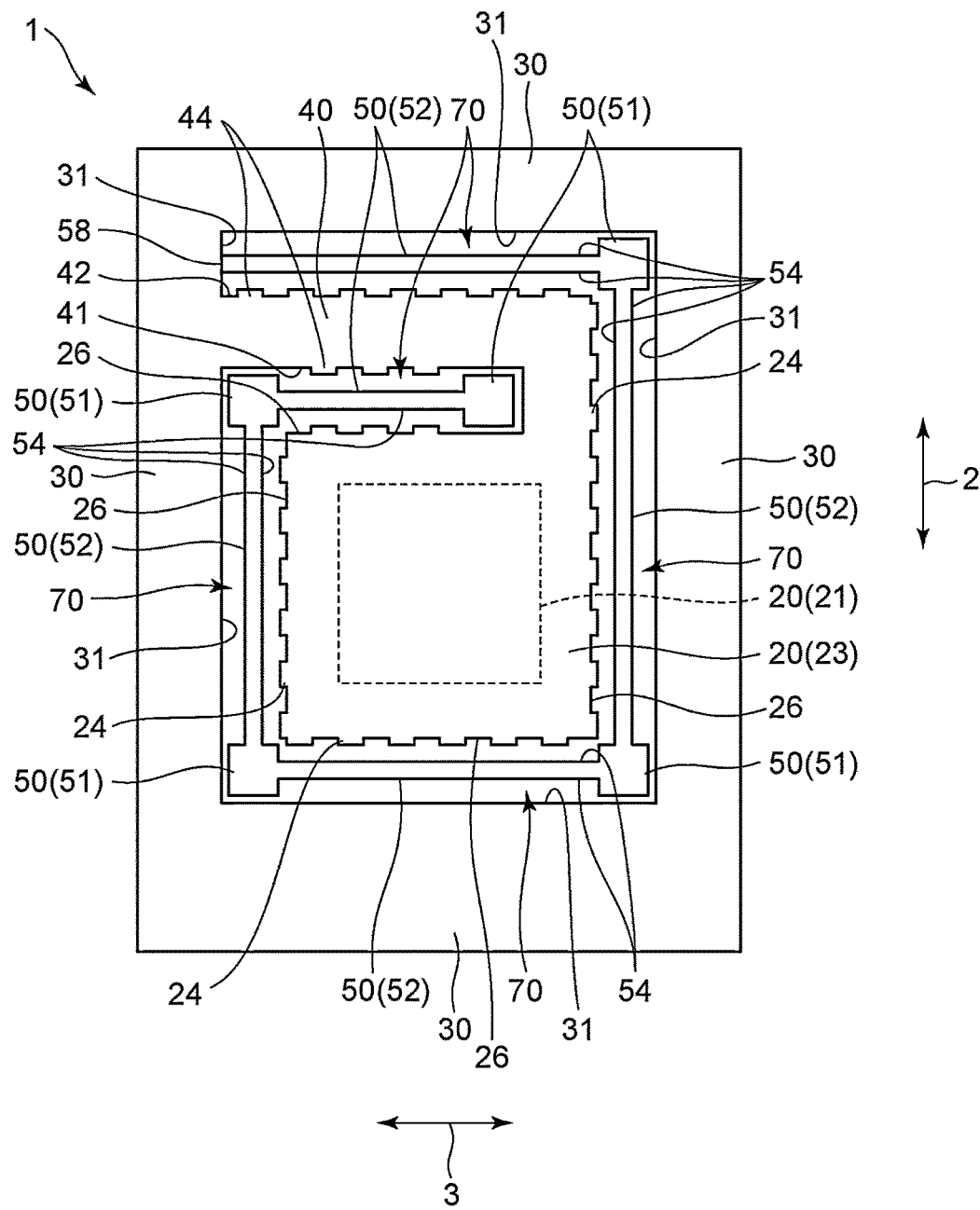
FIG. 7 is a plan view of a pressure sensor according to a fourth preferred embodiment of the present invention.

FIG. 7 is a plan view of a pressure sensor according to a fourth preferred embodiment of the present invention.

The pressure sensor according to the fourth preferred embodiment is different from the pressure sensor according to the first preferred embodiment in that, as illustrated in FIG. 7, the sensor 20 and the coupling portion 40 each include a projection.

As illustrated in FIG. 7, the sensor 20 includes a projection 24 on the outer peripheral surface 26, and the coupling portion 40 has a projection 44 on the side surfaces 41 and 42. The outer peripheral surface 26 and the side surfaces 41 and 42 face the groove 70 and are surfaces facing both side surfaces 54 of the beam 50. The side surfaces 41 and 42 are examples of a coupling side surface. The projection 24 is an example of an outer peripheral projection. The projection 44 is an example of a coupling projection.

In the fourth preferred embodiment, a plurality of projections 24 are provided at a fixed or substantially fixed interval in a direction in which the groove 70 extends. Each projection 24 extends from the upper end to the lower end of the sensor 20 in the height direction 4. The cross section of each projection 24 has a rectangular or substantially rectangular shape. That is, each projection 24 has a quadratic prism shape.

In the fourth preferred embodiment, a plurality of projections 44 are provided at a fixed or substantially fixed interval in a direction in which the groove 70 extends. Each projection 44 extends from the upper end to the lower end of the coupling portion 40 in the height direction 4. The cross section of each projection 44 has a rectangular or substantially rectangular shape. That is, each projection 44 has a quadratic prism shape.

If a liquid such as water intrudes into the groove 70 and is attached to the beam 50 disposed in the groove 70, the sensor 20, the surrounding portion 30, or the coupling portion 40, the beam 50 is stuck to the outer peripheral surface 26 of the sensor 20, the inner peripheral surface 31 of the surrounding portion 30, or the side surface 41 or 42 of the coupling portion 40 due to the surface tension of the liquid, and the beam 50 may remain stuck even after the beam 50 and the like are dried. In this case, there is a possibility that the beam 50 is not able to fully provide the function as a damper portion. On the other hand, according to the fourth preferred embodiment, the sensor 20 includes the projection 24 on the outer peripheral surface 26, and the coupling portion 40 includes the projection 44 on the side surfaces 41 and 42. Therefore, even when the beam 50 comes into contact with the sensor 20, the surrounding portion 30, or the coupling portion 40, the contact area can be reduced. As a result, the above-described sticking or maintenance of the above-described sticking can be reduced or prevented.

In the fourth preferred embodiment, the projections 24 and 44 are provided at a fixed or substantially fixed interval in a direction in which the groove 70 extends, but the above-described interval does not need to be fixed or substantially fixed.

In the fourth preferred embodiment, as illustrated in FIG. 7, the shape and the size of each of pluralities of the projections 24 and 44 are the same or substantially the same, but the shape and the size of each projection 24 and each projection 44 do not need to be the same or substantially the same.

In the fourth preferred embodiment, as illustrated in FIG. 7, the projections 24 are provided over the entire or substantially the entire area of the outer peripheral surface 26, but the projections 24 may be provided only in a portion of the outer peripheral surface 26. For example, the projections 24 may be provided only in both end portions of the outer peripheral surface 26 in the longitudinal direction 2 or the widthwise direction 3. Similarly, in the fourth preferred embodiment, the projections 44 are provided over the entire or substantially the entire area of the side surfaces 41 and 42, but the projections 44 may be provided only in a portion of the side surfaces 41 and 42.

The number of the projections 24 may be less or more than the number illustrated in FIG. 7. For example, only one projection 24 may be provided on each outer peripheral surface 26. Similarly, the number of the projections 44 may be less or more than the number illustrated in FIG. 7.

In the fourth preferred embodiment, each projection 24 and each projection 44 have a quadratic prism, but the shape is not limited to a quadratic prism. For example, each projection 24 and each projection 44 may have a triangular or substantially triangular prism or a semi-cylindrical or substantially semi-cylindrical shape.

In the fourth preferred embodiment, the projection 24 extends from the upper end to the lower end of the sensor 20, but the configuration is not limited thereto, and the projection 24 may be provided only in a portion of an area between the upper end and the lower end of the sensor 20. Similarly, the projection 44 extends from the upper end to the lower end of the coupling portion 40, but the configuration is not limited thereto, and the projection 44 may be provided only in a portion of an area between the upper end and the lower end of the coupling portion 40. For example, the projections 24 and 44 may have a hemispherical or substantially hemispherical shape.

In the fourth preferred embodiment, the projections 24 and 44 extend in the height direction 4, but the projections 24 and 44 may extend in a direction other than the height direction 4.

The outer peripheral surface 26 and the side surfaces 41 and 42 are not limited to a plane surface as illustrated in FIG. 7, and may be, for example, a wave surface as illustrated in FIG. 10. In this case, a portion, of the wave surface, projecting toward the beam 50 corresponds to the projections 24 and 44.

Fifth Preferred Embodiment

Figure 8:
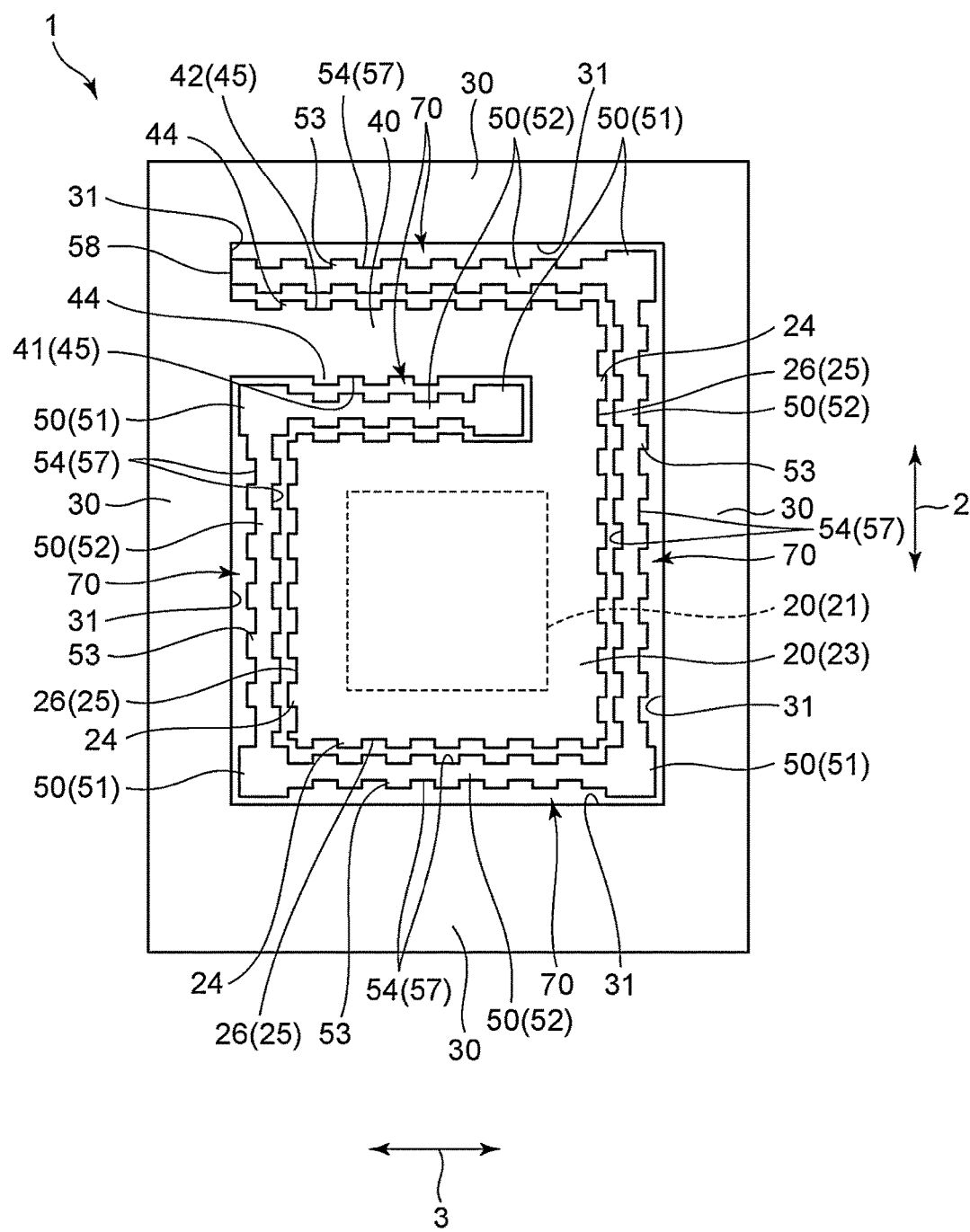
FIG. 8 is a plan view of a pressure sensor according to a fifth preferred embodiment of the present invention.

FIG. 8 is a plan view of a pressure sensor according to a fifth preferred embodiment of the present invention.

The pressure sensor according to the fifth preferred embodiment is different from the pressure sensor according to the first preferred embodiment in that, as illustrated in FIG. 8, the beam 50 includes a projection, and the sensor 20 and the coupling portion 40 each include a projection. That is, the pressure sensor according to the fifth preferred embodiment is a preferred embodiment in which the third preferred embodiment and the fourth preferred embodiment described above are combined.

As illustrated in FIG. 8, the beam 50 includes the projection 53 similar to that in the third preferred embodiment on the side surface 54 of the elastic film 52. The sensor 20 includes the projection 24 similar to that in the fourth preferred embodiment on the outer peripheral surface 26, and the coupling portion 40 includes the projection 44 similar to that in the fourth preferred embodiment on the side surfaces 41 and 42.

In the fifth preferred embodiment, projections provided on each of two surfaces facing each other do not face each other.

Specifically, in a direction in which the groove 70 extends, the projection 53 (an example of a first projection) of the beam 50 facing the outer peripheral surface 26 of the sensor 20 faces a recess 25 (an example of a second recess) provided between two adjacent projections 24, of the outer peripheral surface 26. In addition, in a direction in which the groove 70 extends, the projection 53 of the beam 50 facing the side surface 41 of the coupling portion 40 faces a recess 45 (an example of a third recess) provided between two adjacent projections 44, of the side surface 41. In addition, in a direction in which the groove 70 extends, the projection 53 of the beam 50 facing the side surface 42 of the coupling portion 40 faces the recess 45 (an example of the third recess) provided between two adjacent projections 44, of the side surface 42.

In addition, in a direction in which the groove 70 extends, the projection 24 (an example of a second projection) of the sensor 20 facing the side surface 54 of the beam 50 faces a recess 57 (an example of a first recess) provided between two adjacent projections 53, of the side surface 54 of the beam 50. In addition, in a direction in which the groove 70 extends, the projection 44 (an example of a third projection) of the coupling portion 40 facing the side surface 54 of the beam 50 faces the recess 57 provided between two adjacent projections 53, of the side surface 54 of the beam 50.

That is, in the fifth preferred embodiment, the side surface 54 of the beam 50 facing the groove 70 includes the projection 53 and the recess 57. In addition, the outer peripheral surface 26 of the sensor 20 includes the projection 24 and the recess 25. In addition, the side surfaces 41 and 42 of the coupling portion 40 each include the projection 44 and the recess 45. The projection 24 is located at a position facing the recess 57. The recess 25 is located at a position facing the projection 53. The projection 44 is located at a position facing the recess 57. The recess 45 is located at a position facing the projection 53.

According to the fifth preferred embodiment, the width of the groove 70 can be made constant or substantially constant. Therefore, the advantageous effect of squeeze film damping when an impact acts on the surrounding portion 30 from outside the pressure sensor 1 can be maintained constant or substantially constant at each position of the groove 70.

In the fifth preferred embodiment, the projections 24 and 44 are located at positions where the projections 24 and 44 each face the recess 57, and the recesses 25 and 45 are located at positions where the recesses 25 and 45 each face the projection 53. However, the projections 24 and 44 do not need to face the recess 57, and the recesses 25 and 45 do not need to face the projection 53.

The projection 53 according to the fifth preferred embodiment may have various shapes, be located at various positions and be various numbers, similarly to the third preferred embodiment. The projections 24 and 44 according to the fifth preferred embodiment may have various shapes, be located at various positions, and be various numbers, similarly to the fourth preferred embodiment.

In the fifth preferred embodiment, the elastic film 52 may have a wave form similarly to the third preferred embodiment, and the outer peripheral surface 26 and the side surfaces 41 and 42 may have a wave surface similarly to the fourth preferred embodiment. In this case, the side surface 54 of the elastic film 52 having the wave form is preferably parallel or substantially parallel to the wave surface. That is, it is preferable that a projection (an example of the first projection), of the side surface 54 of the elastic film 52, having the wave shape faces a recess (an example of the second recess and the third recess) of the wave surface, and a recess (an example of the first recess) of the elastic film 52 having the wave shape faces a projection (an example of the second projection and the third projection) of the wave surface.

Sixth Preferred Embodiment

Figure 11:
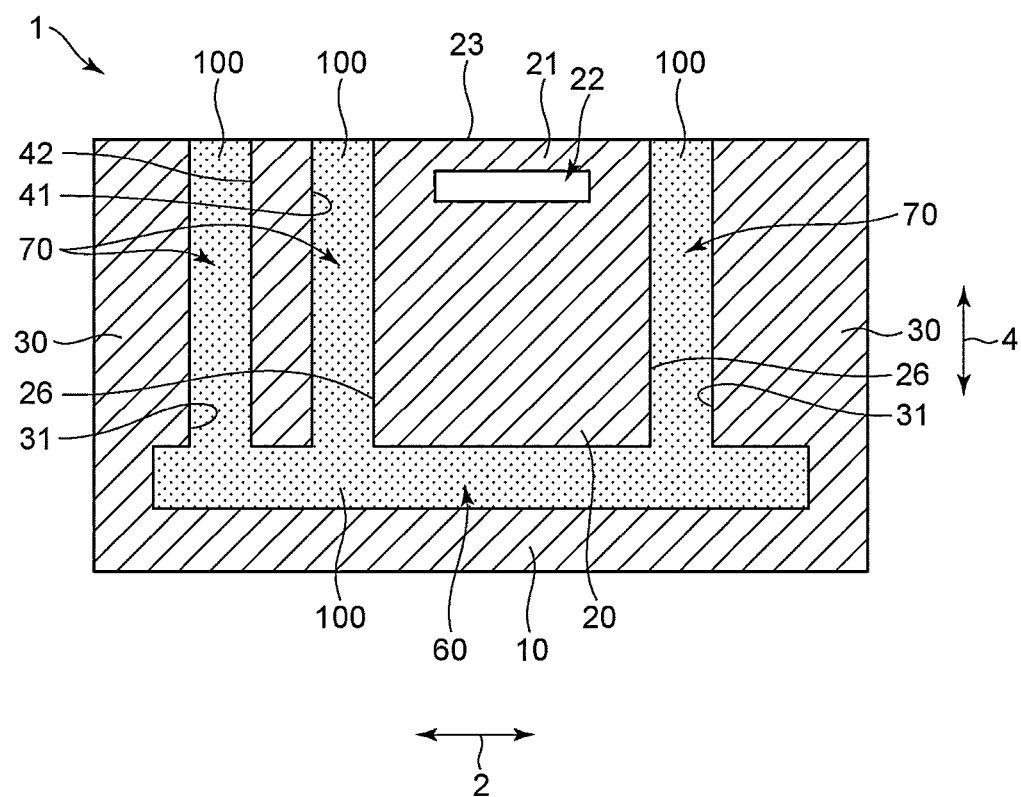
FIG. 11 is a sectional view, similar to FIG. 3, of a pressure sensor according to a sixth preferred embodiment of the present invention.

FIG. 11 is a sectional view, similar to FIG. 3, of a pressure sensor according to a sixth preferred embodiment of the present invention.

The pressure sensor according to the sixth preferred embodiment is different from the pressure sensor according to the first preferred embodiment in that, as illustrated in FIG. 11, instead of the groove 70 being provided with the beam 50, the groove 70 is filled with a gel 100. The gel 100 is an example of the damper portion.

As illustrated in FIG. 11, the gel 100 occupies the entire areas of the space 60 and the groove 70. The liquid surface of the gel 100 is even or substantially even with the sensing surface 23. Note that the gel 100 may occupy only a portion of the space 60 and a portion of the groove 70. For example, the liquid surface of the gel 100 may be located between the upper end and the lower end of the groove 70 in the height direction 4. That is, the gel 100 occupies at least a portion of the groove 70.

The minimum value of the elastic modulus of the gel 100 is, for example, about 0.5 kPa at a complex elastic modulus at a room temperature. Preferably, the minimum value of the elastic modulus of the gel 100 is, for example, about 1 kPa at a complex elastic modulus at a room temperature. More preferably, the minimum value of the elastic modulus of the gel 100 is, for example, about 2 kPa at a complex elastic modulus at a room temperature. The maximum value of the elastic modulus of the gel 100 is, for example, about 30 kPa at a complex elastic modulus at a room temperature. Preferably, the maximum value of the elastic modulus of the gel 100 is, for example, about 10 kPa at a complex elastic modulus at a room temperature. More preferably, the maximum value of the elastic modulus of the gel 100 is, for example, about 5 kPa at a complex elastic modulus at a room temperature. The room temperature is, for example, within a range of about 0° C. or more and about 45° C. or less.

It is preferable that the gel 100 is made of, for example, a fluorine-based or silicon-based material, but is not limited thereto as long as the material satisfies the above-described elastic modulus.

According to the sixth preferred embodiment, when an impact acts on the surrounding portion 30 from outside the pressure sensor 1, transmission of the impact to the sensor 20 from the surrounding portion 30 can be reduced by the gel 100.

According to the sixth preferred embodiment, since the inside of the groove 70 is occupied by the gel 100, intrusion of a liquid such as water into the groove 70 can be prevented.

By appropriately combining preferred embodiments of the present invention, the advantageous effects obtained by each preferred embodiment can be provided. For example, the first preferred embodiment and the sixth preferred embodiment described above may be combined. In this case, the groove 70 is provided with the beam 50, and the groove 70 is also filled with the gel 100.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A pressure sensor comprising:
a base;
a sensor facing the base in a height direction with a space between the sensor and the base to sense pressure applied to a sensing surface on a side opposite to the base in the height direction;
a surrounding portion raised in the height direction from the base and surrounding the sensor with a groove extending around the sensor between the surrounding portion and the sensor;
a coupling portion coupling the sensor with the surrounding portion; and
a damper portion in the groove to apply a resistance to the surrounding portion moving toward the sensor.

2. The pressure sensor according to claim 1, wherein
the sensor includes an outer peripheral surface facing the surrounding portion;
the surrounding portion includes an inner peripheral surface facing the outer peripheral surface;
the groove is between the outer peripheral surface and the inner peripheral surface; and
the damper portion includes a beam supported by the base and extending along the groove with a gap between the beam and at least one of the outer peripheral surface and the inner peripheral surface.

3. The pressure sensor according to claim 2, further comprising:
a cap portion facing the sensing surface with a space between the cap portion and the sensing surface, supported by the surrounding portion, and including a through-hole at a position facing the sensing surface; wherein
a longer gap of a gap between the damper portion and the outer peripheral surface and a gap between the damper portion and the inner peripheral surface has a width shorter than a diameter of the through-hole.

4. The pressure sensor according to claim 2, wherein a beam side surface of the beam facing the groove includes a beam projection.

5. The pressure sensor according to claim 2, wherein the outer peripheral surface includes an outer peripheral projection.

6. The pressure sensor according to claim 2, wherein a coupling side surface of the coupling portion facing the groove includes a coupling projection.

7. The pressure sensor according to claim 2, wherein
a beam side surface of the beam facing the groove includes a first projection and a first recess; and
the outer peripheral surface includes a second recess at a position facing the first projection and a second projection at a position facing the first recess.

8. The pressure sensor according to claim 7, wherein a coupling side surface of the coupling portion facing the groove includes a third recess at a position facing the first projection and a third projection at a position facing the first recess.

9. The pressure sensor according to claim 1, wherein the damper portion includes a gel in at least a portion of the groove.

10. The pressure sensor according to claim 1, wherein the pressure sensor has a rectangular or substantially rectangular parallelepiped shape.

11. The pressure sensor according to claim 1, wherein the base, the sensor, the surrounding portion, the coupling portion, and the damper portion are integrally provided.

12. The pressure sensor according to claim 1, wherein the base, the sensor, the surrounding portion, the coupling portion, and the damper portion are made of a semiconductor material.

13. The pressure sensor according to claim 1, wherein the sensor includes a cavity in an upper portion thereof, and a sensing film above the cavity.

14. The pressure sensor according to claim 1, wherein, in the height direction, an upper end of the surrounding portion is at a same or substantially a same position as an upper end of the sensor.

15. The pressure sensor according to claim 1, wherein the damping portion includes a beam including a pillar and an elastic film.

16. The pressure sensor according to claim 15, wherein a width of the elastic film is less than a width of the groove.

17. The pressure sensor according to claim 15, wherein the pillar is at a location at which the groove is bent.

* * * * *